INVENTOR
PAUL E. NELSON
BY Donald F Voss
ATTORNEY

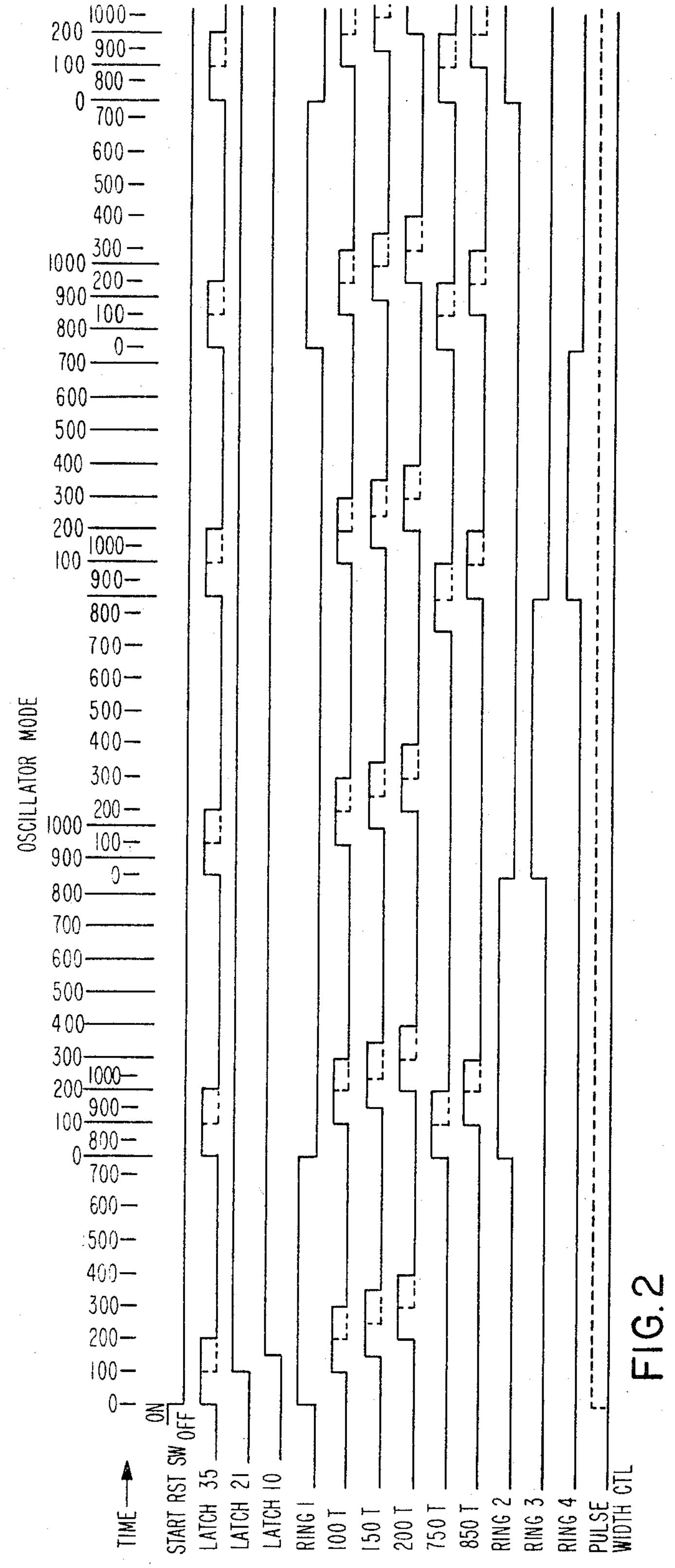
OSCILLATOR MODE
TIME
START RST SW
ON
OFF
LATCH 35
LATCH 21
LATCH 10
RING 1
100 T
150 T
200 T
750 T
850 T
RING 2
RING 3
RING 4
PULSE WIDTH CTL
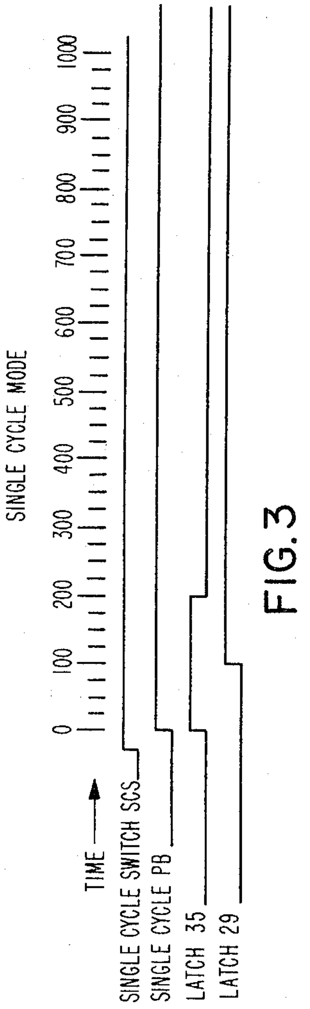
SINGLE CYCLE MODE
TIME
SINGLE CYCLE SWITCH SCS
SINGLE CYCLE PB
LATCH 35
LATCH 29

United States Patent Office 3,440,546

Patented Apr. 22, 1969

3,440,546

VARIABLE PERIOD AND PULSE WIDTH DELAY LINE PULSE GENERATING SYSTEM

Paul E. Nelson, Rochester, Minn., assignor to International Business Machines Corporation, Armonk, N.Y., a corporation of New York Filed Nov. 15, 1965, Ser. No. 507,844
Int. Cl. H03k 5/159
U.S. Cl. 328—56 9 Claims

ABSTRACT OF THE DISCLOSURE

Apparatus is provided for controlling the application of pulses onto a delay line in either a single cycle or oscillator mode with the facility for selecting or varying the oscillator frequency from cycle to cycle and for selectively varying the pulse width.

This invention relates to pulse generating systems and more particularly to a delay line pulse generating system selectively operable in either a single cycle mode or an oscillator mode.

In addition to being selectively operable in either the single cycle or oscillator modes, the length of time between pulses or the oscillation frequency is selectively variable over the length of the delay line and need not be constant for all cycles as is necessary with other types of oscillators. Further, the pulse width can be selectively modified. By having the ability to change the oscillation frequency from cycle to cycle, it is possible to provide control pulses for a system such as a character recognition machine which has certain elements controlled at one frequency and is connected to a central processing unit which sends over operating signals to the character recognition system at another frequency.

The single cycle mode control is also very important because it facilitates checking within a system at various stages therein. For example, the outputs of logical elements can be connected to checking lamps which are turned on if the logical element passes a signal. Thus, under single cycle control, a visual check of the lamps at various stages can be made and faults, if any exist, can easily be detected. When operating in the single cycle mode, the delay line only supplies timing pulses and the oscillator feature is inhibited.

Accordingly, a principal object of the invention is to provide an improved pulse generating system.

Another very important object of the invention is to provide a variable period and pulse width delay line pulse generating system.

Still another very important object of the invention is to provide a delay line pulse generating system which is operable in either an oscillator mode or a single cycle mode.

Still a further object of the invention is to provide a pulse generating system where the oscillation frequency can be changed from cycle to cycle.

Another very important object of the invention is to provide a pulse generating system which can selectively generate variable period and width pulses economically.

The foregoing and other objects, features and advantages of the invention will be apparent from the following more particular description of a preferred embodiment of the invention, as illustrated in the accompanying drawings.

In the drawings:

FIG. 2 is a timing diagram for the oscillator mode; and

FIG. 3 is a timing diagram for the single cycle mode.

Figure 1:
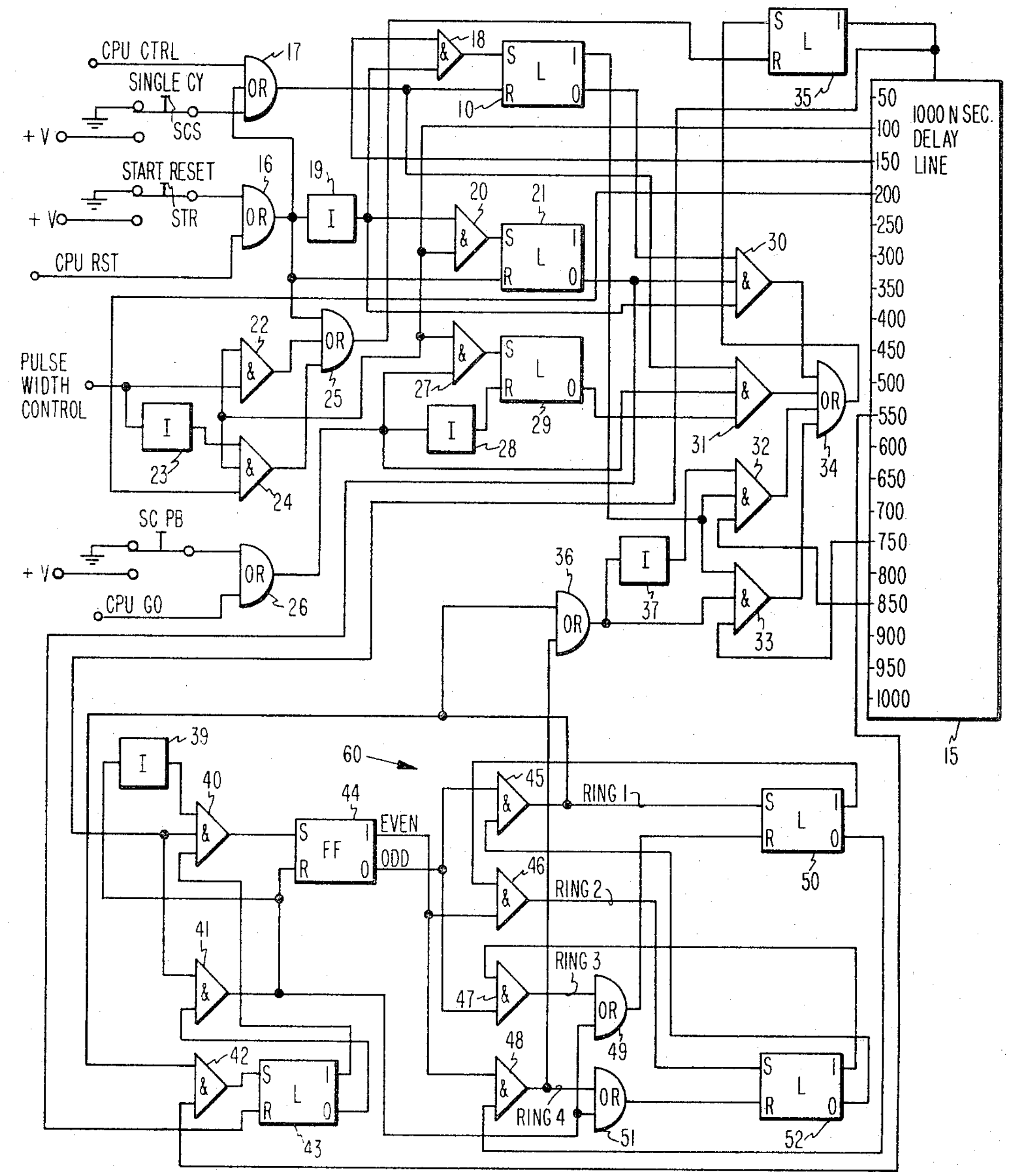
FIG. 1 is a logic diagram of a pulse generating system embodying the invention.

With reference to the drawings, and particularly to FIG. 1, the invention is shown by way of example as including mode control latch 10 which determines if delay line 15 is to be operated in the oscillator or single cycle mode. When it is desired to operate in the oscillator mode, either the central processing unit issues a CPU Reset signal or the push button start reset switch STR is depressed and a signal is passed via logical OR circuit 16 to the reset input of start latch 21 and to inputs of logical OR circuits 17 and 25. The signal is passed by these logical OR circuits to the reset inputs of the mode control latch 10 and the delay pulse latch 35, respectively. It should be noted that the output of logical OR circuit 16 is also connected to the input of inverter 19 which has its output connected to inputs of logical AND circuits 18, 20 and 30. However, since inverter 19 is receiving a positive signal at this time, these logical AND circuits will not be conditioned.

Summarizing at this time, the mode control latch 10, the start latch 21 and the delay pulse latch 35 are reset after the start reset push button switch STR is operated, or if there is a signal CPU Reset. Thereafter, when the start reset switch is released or the CPU Reset signal goes away, the inputs to logical AND circuit 30 are satisfied and a signal is passed via logical OR circuit 34 to set the delay pulse latch 35. The delay pulse latch 35 functions to control the length of the pulse on delay line 15. It should be noted that with the delay pulse latch 35 set, the zero time inputs to logical AND circuits 40 and 41 are available or at an up level. However, logical AND circuit 40 is not condition at this time because 100 time is not available, there is not an output from OR circuit 26 and the start ring latch 43 is in the reset state.

On the other hand, logical AND circuit 41 is conditioned by the reset output of the start ring latch 43 and it passes a signal for resetting the even-odd flip flop 44. It also passes a signal to inverter 39 which has its output connected to an input of logical AND circuit 40. This is to inhibit any attempt to set 44 while it is being reset. The output of logical AND circuit 41 is also connected to inputs of logical OR circuits 49 and 51 which have their outputs connected to the reset inputs of latches 50 and 52 respectively. The reset output of latch 52 is connected to an input of logical AND circuit 45 which also has an input connected to the reset output of flip flop 44. Therefore, with flip flop 44 and latch 52 reset, logical AND circuit 45 has an output signal and this signal is indicative of a Ring 1 condition of select ring 60. Select ring 60 consists of latches 50 and 52 and logical AND circuits 45 to 48 inclusive and logical OR circuits 49 and 51 for developing four discrete ring outputs, i.e., Ring 1, Ring 2, Ring 3 and Ring 4. The Ring 1 and Ring 4 outputs, as it will be seen shortly hereinafter, are used for conditioning logical AND circuits 32 and 33 which are effective for controlling the setting of the delay pulse latch 35.

At this time, the delay pulse latch 35 is set and a Ring 1 signal is available. Logical AND circuit 20 has inputs from the 100 nanosecond output of delay line 15 and the output of inverter 19. Therefore, when the pulse in delay line 15 reaches the 100 nanosecond position, the inputs to logical AND circuit 20 are satisfied, and the start latch 21 is set. With the start latch 21 set, logical AND circuit 30 is no longer conditioned. Thus, it is seen that the start latch functions to develop the first pulse through the delay line by means of its reset output. The width of the first pulse in the delay line 15 is under the control of logic circuitry for resetting the delay pulse latch 35.

The reset input of the delay pulse latch 35 is connected to the output of logical OR circuit 25. Logical OR circuit 25 in addition to the input from logical OR 16 also has inputs connected to the outputs of logical AND circuits 22 and 24. Logical AND circuit 22 is conditioned by a Pulse Width Control signal. The Pulse Width Control signal can originate from any control device such as a switch or latch. In this example, only two different pulse widths can be selected. It should be recognized that any number of pulse widths can be selected by adding additional control signals. The 100 nanosecond output position of delay line 15 is connected to inputs of logical AND circuits 22 and 24. The Pulse Width Control signal is connected directly to an input of logical AND circuit 22 and is also connected to an input of inverter 23 which has its output connected to an input of logical AND circuit 24. Thus, if the Pulse Width Control signal is present, logical AND circuit 22 is conditioned and logical AND circuit 24 is not and, if absent, the conditions are reversed.

Assuming logical AND circuit 22 is conditioned by the Pulse Width Control signal as shown by the dashed line in FIG. 2, then when the pulse in the delay line 15 reaches the 100 nanosecond position, logical AND circuit 22 passes a signal via logical OR circuit 25 for resetting the delay pulse latch 35. The pulse on the delay line then has a width of 100 nanoseconds as shown by the dashed line in FIG. 2. On the other hand, if the Pulse Width Control signal is not present as shown by the solid line in FIG. 2, then logical AND circuit 24 is conditioned. Logical AND circuit 24 also has an input connected to the 200 nanosecond output of delay line 15. It should be noted that the 200 nanosecond output from delay line 15 is sufficient by itself to control the length of the pulse on the delay line to 200 nanoseconds. However, by also including the 100 nanosecond connection to logical AND circuit 24 it illustrates that by means of logical AND circuits it is possible to take the 200 nanosecond pulse from the delay line 15 and develop a 100 nanosecond pulse. More specifically a 200 nanosecond pulse on delay line 15 will be present at the 100 nanosecond output for 200 nanoseconds. The same pulse will also be present at a subsequent time at the 200 nanosecond output for 200 nanoseconds. However, the 200 nanosecond pulse will be simultaneously present at the 100 and 200 nanosecond outputs for only a period of 100 nanoseconds. Thus, by providing the proper input connections to logical AND circuits from the delay line outputs, it is possible to generate a pulse which is of a shorter duration than the pulse on the delay line 15.

The delay pulse latch 35, when in the oscillator mode, i.e., with the mode control latch 10 set, is again set according to the desired oscillator frequency. In this particular example, when operating in the oscillator mode, the delay pulse latch can be set by output signals from either logical AND circuits 32 or 33 which are conditioned by output signals from select ring 60. This arrangement permits the change of oscillation frequency from cycle to cycle.

The select ring 60 outputs are used for selecting the oscillation frequency. The outputs of logical AND circuits 45 and 48 representing Ring 1 and Ring 4, respectively, are connected to inputs of logical OR circuit 36. The output of logical OR circuit 36 is connected to an input of logical AND circuit 33, and to the input of inverter 37. The output of inverter 37 is connected to an input of logical AND circuit 32. Both logical AND circuits 32 and 33 are conditioned by the set output of the mode control latch 10. In addition to the inputs already mentioned, logical AND circuit 33 has an input connected to the 750 nanosecond output of the delay line 15. Thus, when the 200 nanosecond pulse on delay line 15 reaches the 750 nanosecond output, logical AND circuit 33 passes a signal for setting the delay pulse latch 35. With the delay pulse latch 35 set, another pulse is put on the delay line 15. This pulse will have a pulse width determined by the outputs from logical AND circuits 22 and 24 as previously described. In FIG. 2, the delay pulse latch 35 is shown as being set for a period of 200 nanoseconds. Thus, a second 200 nanosecond pulse appears on the delay line. This occurs 750 nanoseconds after the initiation of the first pulse on delay line 15. This provides an oscillator frequency of 750 nanoseconds.

The select ring 60 is advanced and a Ring 2 signal becomes available. The start ring latch 43 is set when the first pulse on the delay line reaches the 550 nanosecond output. Logical AND circuit 42 is conditioned by the Ring 1 output from logical AND circuit 45. The set output of the start ring latch 43 is connected to an input of logical AND circuit 40. With latch 43 set, the output from logical AND circuit 41 is at a down level, and the output from inverter 39 will be at an up level to further condition logical AND circuit 40. Logical AND circuit 40 also has an input connected to the set output of the delay pulse latch 35. Thus, when this latch is again set, and latch 35 is set, logical AND circuit 40 passes a signal for setting flip flop 44. The set output of flip flop 44 is connected to condition logical AND circuits 46 and 48. However, only logical AND circuit 46 is conditioned at this time by the set output of latch 50. The Ring 2 signal is taken from the output of logical AND circuit 46. The output of logical AND circuit 46 is also connected to the set input of latch 52. Thus, the latch 52 becomes set at this time.

The oscillator operation is no longer under control of Ring 1 and consequently logical AND circuit 33 is not conditioned. Logical AND circuit 32 however, is conditioned and it will pass a signal via logical OR circuit 34 for setting the delay pulse latch 35 when the pulse on the delay line reaches the 850 nanosecond output. With the delay pulse latch 35 again set, another pulse is put onto the delay line 15. However, the oscillator frequency has now changed to 850 nanoseconds. This oscillator frequency is sustained for another cycle after the select ring 60 advances whereby a Ring 3 output is passed by logical AND circuit 47 to enable conditioning logical AND circuit 32 and inhibiting logical AND circuit 33. Thereafter, the oscillator frequency reverts to a frequency of 750 nanoseconds. This occurs when the Ring 4 signal is available from the output of logical AND circuit 48. The Ring 4 signal conditions logical AND circuit 33 and inhibits logical AND circuit 32. It should be understood that each discrete ring output of select ring 60 could be used to select different oscillator frequencies. This would be accomplished by providing logical AND circuits in addition to 32 and 33, which would have different inputs from the delay line 15.

From the foregoing, it is seen that when operating in the oscillator mode, the frequency can be varied from cycle to cycle or can remain constant on a selective basis. Further, it is seen that the pulse width can also be selectively varied. Additionally, it is also seen that pulses of different widths can be developed by taking different outputs from the delay line and combine them logically.

The single cycle mode of operation is activated by depressing the single cycle switch or by a CPU Control signal from a central processing unit. This provides a signal via logical OR circuit 17 for resetting the mode control latch 10 and for conditioning logical AND circuit 31. The single cycle switch SCS when operated, provides a signal level, rather than a pulse. After the operation has been switched into the single cycle mode, the single cycle operation is initiated by operating a single cycle push buttom switch SCPB or by a Go signal from a central processing unit. In either instance, a pulse is passed by logical OR circuit 26 to logical AND circuit 31 which is conditioned at this time because there is an output from logical OR circuit 17 and the one shot latch 29 is in its reset state. The output signal from logical AND circuit 31 is passed via logical OR circuit 34 to set the delay pulse latch 35. This puts a pulse on the delay line 15. Thereafter, when the pulse reaches the 100 nanosecond output, the input conditions to logical AND circuit 27 are satisfied, and the one shot latch 29 is set. With the one shot latch 29 set, logical AND circuit 31 is inhibited and another pulse cannot be put on the line 15 after the delay pulse latch 35 is reset until either the push button switch SCPB is again operated or another Go signal is received from the central processing unit.

The resetting of the delay pulse latch 35 takes place in the manner previously indicated, i.e., the latch 35 is reset by a signal from either logical AND circuit 22 or 24. It should be noted that since the mode control latch 10 is in its reset state, logical AND circuits 32 and 33 are inhibited. Further, since a signal is not passed by logical OR circuit 16 during the single cycle operation, a signal cannot be passed by logical AND circuit 30 for setting the latch 35.

From the above, it is seen that the invention provides a pulse generation system which can operate in an oscillator mode or in a single cycle mode. When in the oscillator mode, the frequency from cycle to cycle can be selectively varied. The pulse width can be selected in either mode of operation. The oscillator mode can be stopped by setting the single cycle switch SCS or by maintaining the start reset switch STR depressed or by providing a continuous reset signal from a central processing or other control unit. When in the single cycle mode, a pulse is entered onto the delay line and only one pulse goes down the delay line for each depression of the single cycle push button switch SCPB or from a Go signal from a central processing or other control unit.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A pulse generating system comprising:
a delay line having an input and a plurality of output terminals along the length thereof;
a bistable switching device connected to the input of said delay line and operable in one state to start a pulse on said line and in the other state to terminate the pulse on said line; and
control means connected to said bistable device and to selected output terminals of said delay line selectively operable for switching said bistable switching device to said one state and from one said state to said other state.

2. The pulse generating system of claim 1 wherein said control means further includes single cycle control means connected to effect a single successive switching of said bistable device to its one state and then to its other state.

3. The pulse generating system of claim 1 wherein said control means further includes means connected to switch said bistable switching device at different rates from one cycle of operation to a subsequent cycle of operation.

4. The pulse generating system of claim 1 wherein said control means further includes means for selectively controlling the time interval between switching said bistable device from said one to said other state.

5. The pulse generating system of claim 1 wherein said control means further includes frequency selection control means connected to said delay line and said switching device for selecting the outputs of said delay line for sustaining generation of control signals to operate said switching device.

6. The pulse generating system of claim 4 wherein selected outputs from said delay line are connected to said time interval control means, the same being responsive thereto for switching said bistable device from said one to said other state at different times.

7. A pulse generating system comprising a delay line having an input and a plurality of different output terminals along the length thereof;
a bistable switching device having one output according to one state connected to the input of said delay line whereby whenever said switching device is in said one state a pulse is started on said line and the width of said pulse is determined by the time interval between said switching device being in said one state and switching to its other state;
switching means having inputs connected to selected outputs of said delay line and outputs connected to said bistable switching device; and
mode control means connected to said switching means for selectively controlling the operation thereof in single cycle and oscillator modes.

8. The pulse generating system of claim 7 wherein said switching means is operable to switch said bistable device to said one state at different frequencies from cycle to cycle.

9. The pulse generating system of claim 7 wherein said switching means is operable to switch said bistable device from said one to said other state, after said bistable device has been in said one state for different lengths of time.

References Cited

UNITED STATES PATENTS

| | | | |
|---|---|---|---|
| 2,445,448 | 7/1948 | Miller | 328—67 XR |
| 3,096,445 | 7/1963 | Herzog | 307—88.5 |
| 3,139,594 | 6/1964 | Ressler | 328—66 XR |
| 3,260,860 | 7/1966 | Kozikowski | 328—58 XR |
| 3,265,975 | 8/1966 | Kirkpatrick | 328—63 |

OTHER REFERENCES

"Reflex Delay Line Memory Clock" by Dohermann in IBM Technical Disclosure Bulletin, vol. 8, No. 1, June 1965, p. 70.

ARTHUR GAUSS, *Primary Examiner.*

STANLEY D. MILLER, *Assistant Examiner.*

U.S. Cl. X.R.

307—265, 271, 293; 328—58, 60